United States Patent
Ambilkar et al.

(10) Patent No.: US 7,552,307 B2
(45) Date of Patent: Jun. 23, 2009

(54) METHOD FOR INITIALIZING A RANDOM ACCESS MEMORY

(75) Inventors: Shridhar Narasimha Ambilkar, Bangalore (IN); Girish Gopala Kurup, Karnataka (IN); Ashutosh Misra, Karnataka (IN)

(73) Assignee: International Business Machines Corporation, Armonk, NY (US)

( * ) Notice: Subject to any disclaimer, the term of this patent is extended or adjusted under 35 U.S.C. 154(b) by 326 days.

(21) Appl. No.: 11/496,369

(22) Filed: Jul. 31, 2006

(65) Prior Publication Data

US 2006/0271730 A1    Nov. 30, 2006

Related U.S. Application Data

(62) Division of application No. 10/736,057, filed on Dec. 15, 2003, now Pat. No. 7,093,065.

(51) Int. Cl.
*G06F 12/00* (2006.01)
*G06F 12/12* (2006.01)

(52) U.S. Cl. .......................... 711/170; 711/166; 713/1

(58) Field of Classification Search ................. 711/170, 711/166; 713/1
See application file for complete search history.

(56) References Cited

U.S. PATENT DOCUMENTS 5,893,162 A * 4/1999 Lau et al. .................... 711/153
6,529,519 B1 * 3/2003 Steiner et al. ............... 370/412

* cited by examiner

*Primary Examiner*—Reginald G Bragdon
*Assistant Examiner*—Aracelis Ruiz
(74) *Attorney, Agent, or Firm*—Anthony V S England; William Steinberg; T. Rao Coca

(57) ABSTRACT

A memory has a set of address spaces to which token data is written and read. Each address space has a token status bit. A token generator allocates token data to the memory address spaces. Upon a reset occurring, a logic circuit provides logic "0" to the token generator disabling status bit checking control so that all the tokens can be issued sequentially. New token data is allocated to the address spaces sequentially and the respective status bit is updated or maintained as logic "1". When all address spaces have been allocated, the logic circuit provides the actual state of the status bit to the token generator to control subsequent allocations.

11 Claims, 4 Drawing Sheets

METHOD FOR INITIALIZING A RANDOM ACCESS MEMORY

CROSS-REFERENCE TO RELATED APPLICATION

This application is a divisional of prior application Ser. No. 10/736,057, which was originally filed on Dec. 15, 2003 now U.S. Pat. No. 7,093,065.

FIELD OF THE INVENTION

The present invention relates to the initialization of Random Access Memory (RAM).

BACKGROUND

In packet-based communication systems, an initiator sends a read-request packet to a target device. The target sends back a response data packet after some time. For the effective transmission of packets, the device should be able to send many read-request packets before receiving response packets from the target. To support this, the initiator assigns a token/tag to each read-request packet. The initiator can thus identify and handle response packets. The target should use the same token/tag in a response packet. The token is freed up and can be reused once this two-way transaction is completed. For each outstanding token, the initiator needs to remember properties such as address, data length, etc., of the read-request-packet, until a response packet is received.

At the start of a session all tokens are available and can be issued in any order. Once all the tokens are consumed, however, a new read-request packet can be formed only after a response packet is received to release the associated token. This situation occurs also in other applications of storage elements beyond packet-based communication systems.

A communications system will typically have 1024 or more tokens, and against each token, information about the read-request packet is stored (e.g. a 32 bit address, 12 bit data length, etc.). A circuit designer is thus forced to make use of SRAM/register-arrays instead of flip-flops to store this information and to save on chip area.

FIG. 1 shows a memory 10 that stores a set of token information 12, addressed as 0000 to 1023. The Most Significant Bit (MSB) 14 is used to indicate token status; a logic '1' indicates token is in use and a logic '0' indicates a token is free. Token information is output by the read port 22 to generate a respective token 24. To generate a new token, a memory controller firstly needs to check the status bit to determine whether the token address is already in use or not.

When memory is implemented in SRAM a problem that arises is the initial (power on) values of the SRAM locations cannot be predicted. A discrete "zeroing task" of the memory addresses thus required upon power-on, or soft reset, so that token assignment can occur in a sequential manner.

Since only one location can be accessed at a time, in this example, initialization requires 1024 clock cycles. As the size of the array increases, the time needed to initialize the RAM will increase, requiring the other parts of the related system to wait until the initialization completes. This can cause considerable performance degradation.

FIG. 2 shows a further implementation, in which an address generator (binary counter) 30 is used to access all locations of the RAM 10 during initialization. By counting through the set of addresses via the write address port 18, all status bit locations 14 are initialized with known value of logic "0" via the write port 20.

Once the address counter reaches address no. 1023, an overflow condition is generated, and an RS flip-flop 32 causes a logical multiplexer 34 to connect a token generator 36 to the write address port 18.

SUMMARY

A full reset of the status bit of each token address space can be avoided by disabling the status bit check during a first round of token assignment. The addresses can then be overwritten as tokens need to be allocated. Once the full set of addresses is used, the status bit check becomes active.

A memory has a set of address spaces to which token data is written and read. Each address space has a token status bit. A token generator allocates token data to the memory address spaces. Upon a reset occurring, a logic circuit provides logic "0" to the token generator indicating the current token is not in use. New token data is allocated to the address spaces sequentially and the respective status bit is updated or maintained as logic "1". When all address spaces are allocated, the logic circuit provides the actual state of the status bit to the token generator to control subsequent allocations.

This arrangement helps in avoiding the full reset of the status bits in the memory and thereby saving the clock cycles required to initialize them.

DETAILED DESCRIPTION

Figure 3:
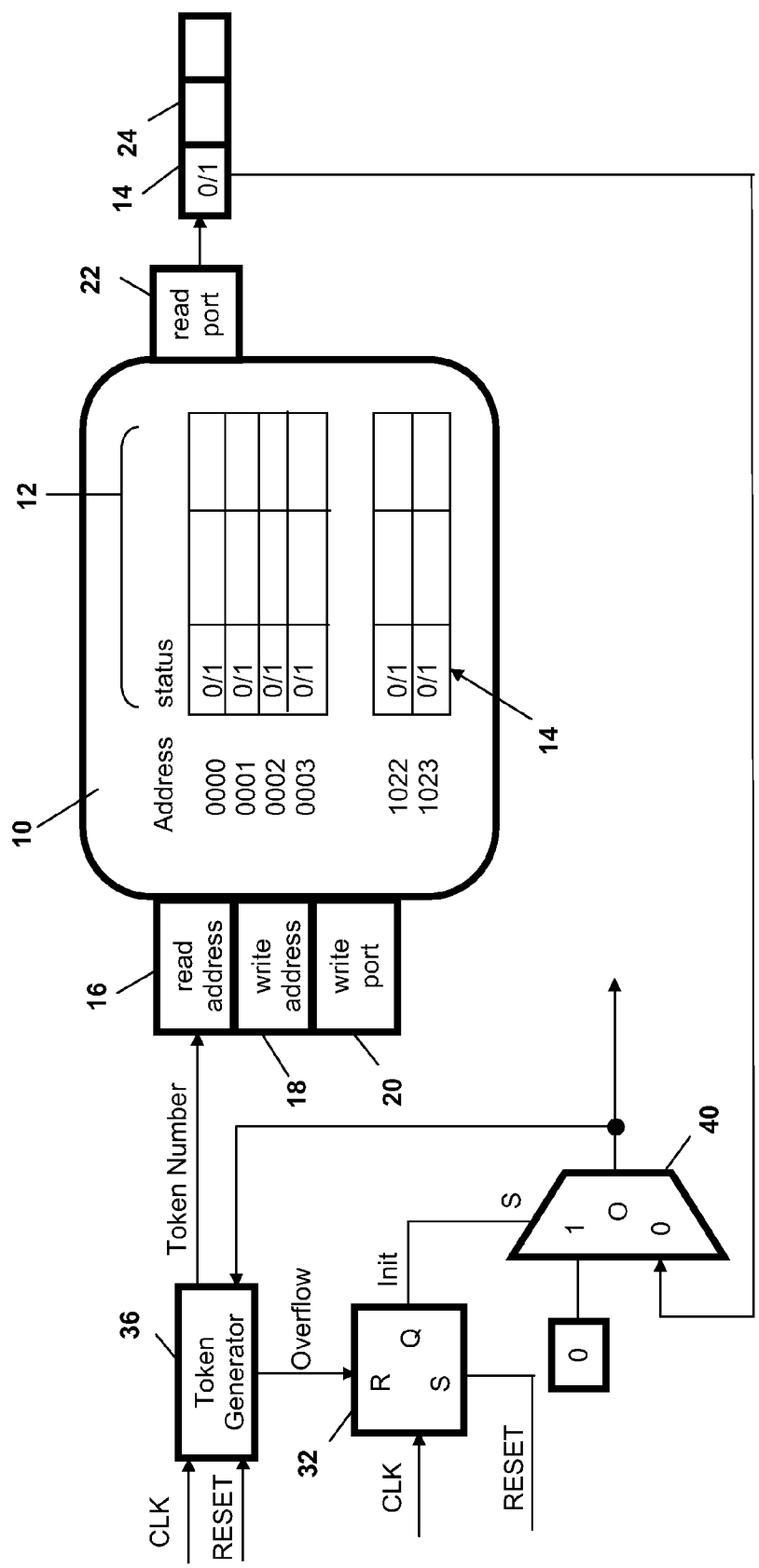
FIG. 3 is a memory arrangement embodying the invention.
Figure 4:
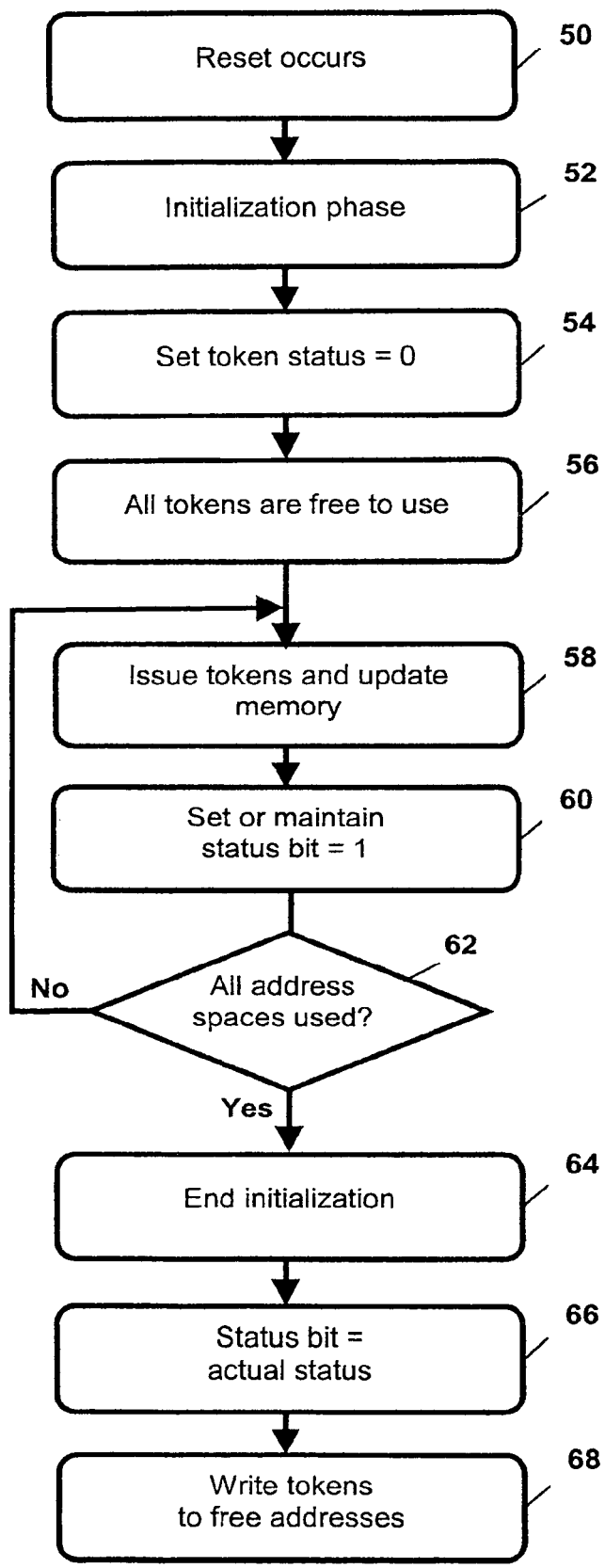
FIG. 4 is a flow diagram relating to the arrangement of FIG. 3.

FIG. 3 shows a memory arrangement embodying the invention, and should be read in conjunction with the flow diagram of FIG. 4.

On the occurrence of a reset event (step 50), a logic signal is clocked to the Reset input of the token generator 36 and to the S terminal of the RS flip-flop 32. The Q output of the flip-flop 32 is thus set to logic 1, indicating an initialisation phase (step 52). Logic 1 appears at the S terminal of a logical multiplexer 40 causing output of logic 0 (step 54) at the multiplexer output O. This is also fed-back to the token generator 36 indicating that all the tokens are free to use and can be issued in a sequence (step 56). The token status is thus assumed to be logic 0, indicating that no tokens are in use eventhough tokens may be existing within the memory address locations.

The token generator 36 is free to issue tokens and update the address spaces 12 via the write address port 18, typically, in this example, commencing from address 000 and progressing to address 1023. Any existing token is over-written. The respective status bit 14 is updated or remains with logic 1 as each token data is written to an address 12 (step 60).

The token generator 36 determines whether all addressed spaces have been used (step 62) and, if so, determines the end of the initialisation phase (step 64), and logic 1 appears on the overflow output of the token generator 36 to the R input of the flip-flop 32. This forces the Q output of the flip-flop 32 to logic 0, which, in turn, sets the output of the multiplexer 40 to the value appearing at the "0" input thereof. The "0" input of the multiplexer 40 receives the most significant bit of the token data 24 that has been pointed to, which, in turn, is provided by the output "O" of the multiplexer 40 to the token generator 36. In this way, the token generator 36 points to an address and receives an indication of whether a token can be issued and the corresponding memory location can be written based on the respective status bit 14 (step 66). Token data can now be written to available address spaces as they become available in the usual course of operation of the memory 10 (step 68).

Figure 1:
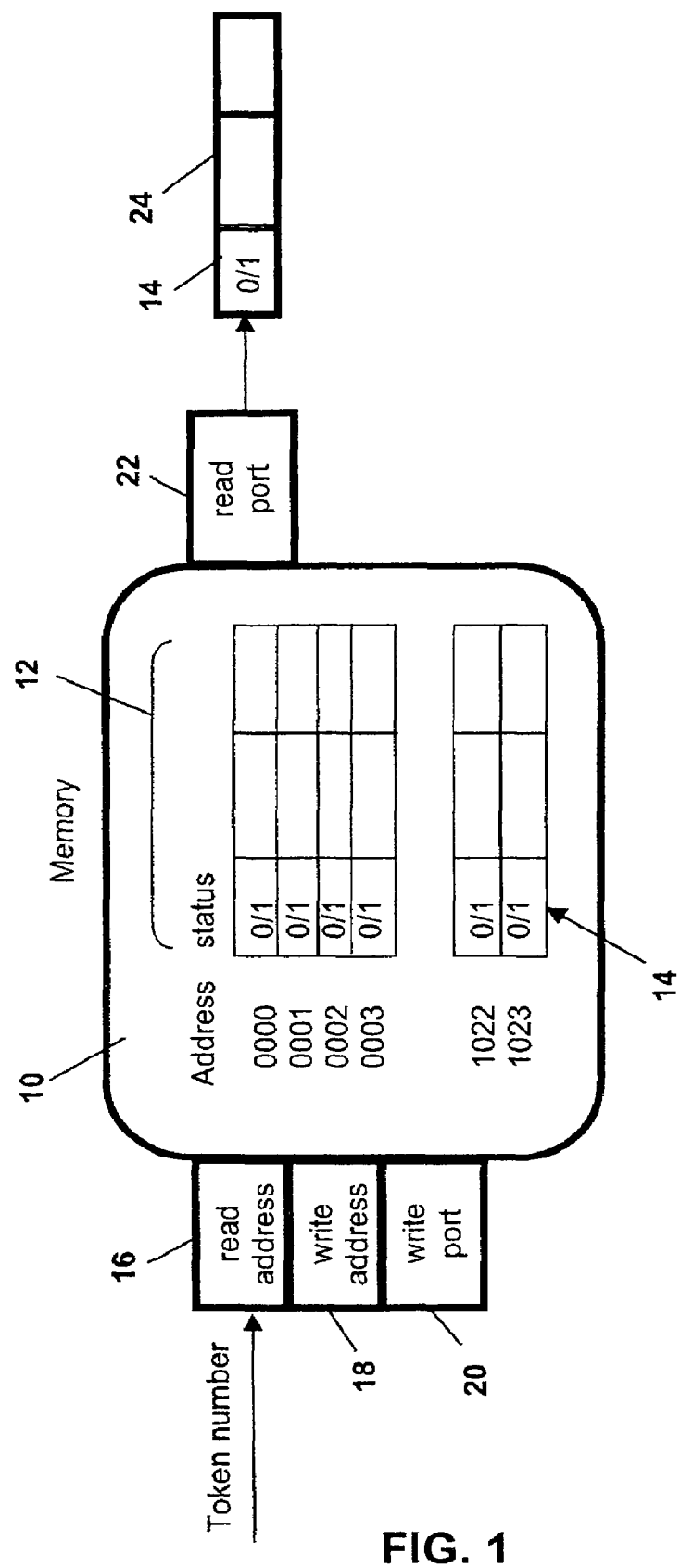
FIG. 1 is a known memory circuit.
Figure 2:
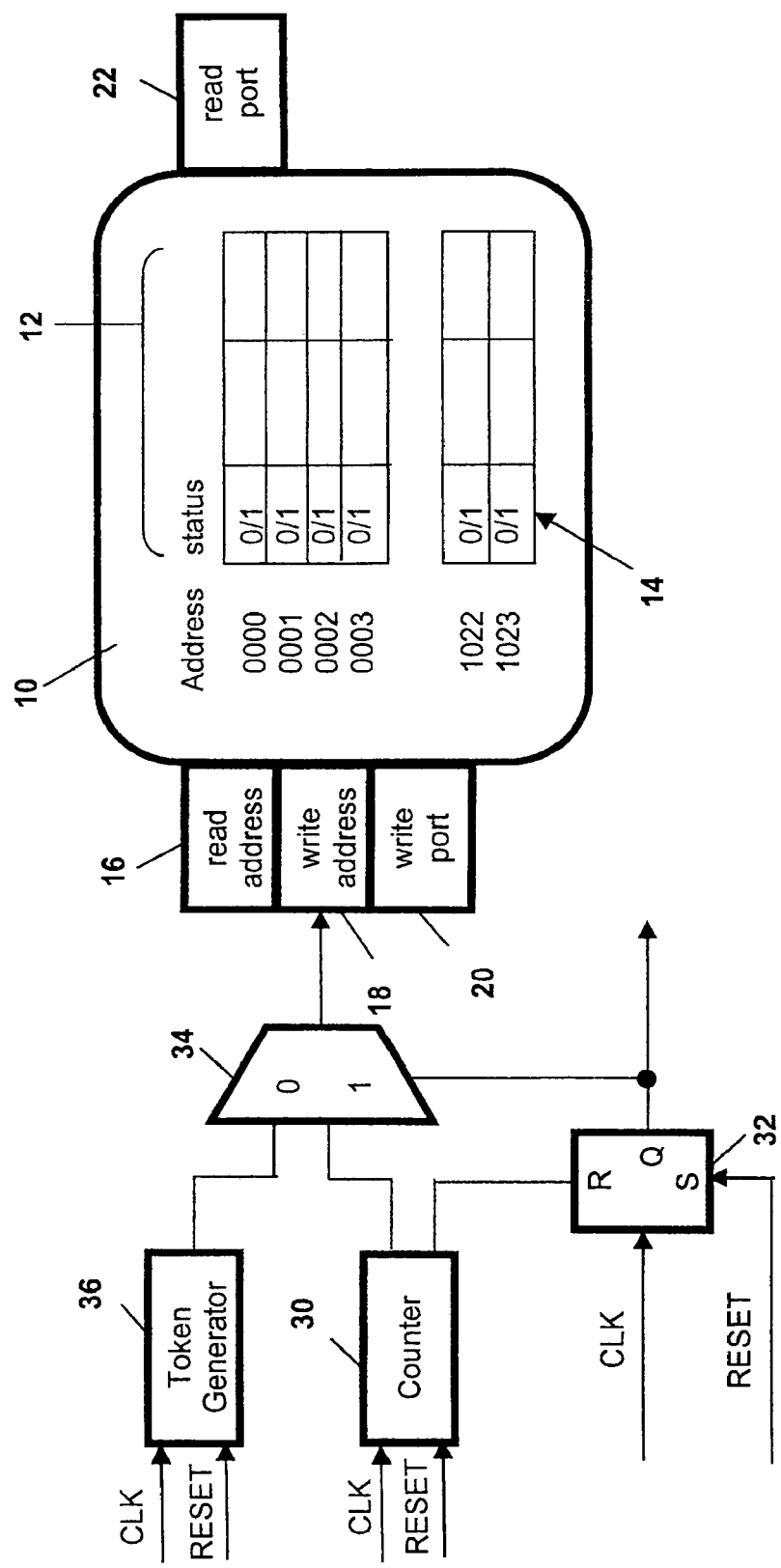
FIG. 2 is a known memory arrangement having reset logic.

In the conventional method described with reference to the example of FIG. 2, at least 1024 clock cycles are needed to initialize the status bit of the RAM. In the embodiment described, there is no need to wait for the initialization of status bits 14 in RAM 10. Tokens can be issued immediately after reset. In effect the initialization gets completed in the background when all tokens are issued a first time.

CONCLUSION

A memory having 1024 address locations is understood to be merely exemplary. Various alterations and modifications can be made to the techniques and arrangements described herein, as would be apparent to one skilled in the relevant art.

We claim:

1. A method for initializing a Random Access Memory (RAM) having a set of address spaces, comprising the steps of:
   detecting a reset event;
   disabling status bits of said set of addresses spaces;
   over-writing token data, when allocated, sequentially to said address spaces, and updating respective status bits upon each write event; and
   when all said address spaces are occupied, enabling said stats bits to be active upon address tokens being read from and written to said RAM.

2. A method for initializing a Random Access Memory (RAM) having a set of address spaces for token data and a respective status bit, comprising the steps of:
   detecting a reset event;
   discarding any allocated token data;
   allocating token data to said address spaces sequentially and setting or maintaining a status bit to logic "1" upon each allocation; and
   when all said address spaces are occupied, reverting to actual status bit condition for subsequent token data allocations, wherein in the actual status bit condition, allocation of token data to a respective one of the token address spaces includes the steps of reading the status bit of the respective one of the token address spaces and is responsive to a result of the reading.

3. An initialization method in a random access memory circuit having token memory locations, the method comprising:
   generating an allocation mode signal having an initial allocation mode logic state and a normal allocation mode logic state; and
   allocating tokens to the respective memory locations, wherein the memory locations have respectively associated status bits and wherein the allocating of the tokens to the respective memory locations includes:
      writing or maintaining states of the status bits to indicate the respective memory locations have current tokens;
      allocating the tokens in an initial allocation mode responsive to the allocation mode signal being in the initial allocation mode logic state; and
      allocating the tokens in a initial allocation mode responsive to the allocation mode signal being in the normal allocation mode state;
   wherein in the initial allocation mode, the allocating of a token to a memory location includes:
      selecting a memory location for a token independently of the state of the memory location's status bit; and
   wherein in the normal allocation mode, the allocating of a token to a memory location includes:
      selecting a memory location for a token responsive to the state of the memory location's status bit.

4. The method of claim 3, the allocating of the tokens in the initial allocation mode includes:
   allocating the tokens to sequential memory locations.

5. The method of claim 3, wherein generating the allocation mode signal in the initial allocation mode logic state includes:
   generating the allocation mode signal in the initial allocation mode logic state responsive to a reset event.

6. The method of claim 5, wherein generating the allocation mode signal includes:
   generating the allocation mode signal by an R-S flip-flop.

7. The method of claim 5, wherein generating the allocation mode signal includes:
   generating the allocation mode signal by an R-S flip-flop, the output R-S flip-flop providing the allocation mode signal;
   wherein the method includes:
   generating a token status signal by a multiplexer having an output first and second data inputs, and a select input for selecting whether data applied to the first data input or data applied to the second data input is supplied to the output, the select input being connected to receive an output of the R-S flip-flop, the multiplexer first input being connected to receive the status bit of a selected memory location, the multiplexer second input being connected to receive a certain fixed logic state, wherein the reset event includes:
   receiving a reset signal on one input of the R-S flip-flop, wherein the R-S flip-flop output responsively causes the multiplexer to select the certain fixed logic state for the multiplexer output, wherein the multiplexer output provides a token status signal connected to a token generator, wherein in the initial allocation mode the token status signal has the fixed logic state and in the normal allocation mode the token status signal indicates the state of a memory location's status bit, and wherein the memory location selecting is responsive to the token status signal in both allocation modes, so that, in turn, the selecting is responsive to the state of the memory location's status bit in the normal allocation mode and is independent of the state of the memory location's status bit in the initial allocation mode.

8. The method of claim 7, wherein the random access memory circuit has a certain number of the memory locations and the method includes:
   counting allocated tokens by the token generator;
   comparing the count of allocated tokens to the number of memory locations by the token generator; and
   sending a signal by the token generator to another input of the R-S flip-flop responsive to the comparing indicating that all the memory locations are occupied wherein the R-S flip-flop output responsively causes the logic multiplexer to select the status bit of a selected memory location for the multiplexer output.

9. The method of claim 3, wherein the random access memory circuit has a certain number of the memory locations and the method includes:
   counting allocated tokens;

comparing the count of allocated tokens to the number of memory locations; and wherein generating the allocation mode signal includes:

generating the allocation mode signal in the normal allocation mode logic state responsive to the comparing indicating that all the memory locations are occupied.

10. The method of claim 3, wherein the method includes:

generating a taken status signal by a multiplexer, wherein in the initial allocation mode the token status signal has a fixed logic state and in the normal allocation mode the token status signal indicates the state of a memory location's status bit wherein the memory location selecting is responsive to the token status signal in both allocation modes, so that the selecting is responsive to the state of the memory location's status bit in the normal allocation mode and is independent of the state of the memory location's status bit in the initial allocation mode.

11. The method of claim 3, wherein allocating tokens to the respective memory locations includes:

allocating tokens by a token generator.

* * * * *